United States Patent [19]

Lussier

[11] Patent Number: 4,684,597

[45] Date of Patent: Aug. 4, 1987

[54] NON-PRECIPITATING QUINONE DIAZIDE POLYMER CONTAINING PHOTORESIST COMPOSITION WITH O-QUINONE DIAZIDE TRISESTER AS DISSOLUTION INHIBITOR

[75] Inventor: Barbara B. Lussier, Rochester, N.Y.

[73] Assignee: Eastman Kodak Company, Rochester, N.Y.

[21] Appl. No.: 791,271

[22] Filed: Oct. 25, 1985

[51] Int. Cl.$^4$ .......................... G03C 1/54; G03C 1/58
[52] U.S. Cl. .................................. 430/190; 430/192; 430/193
[58] Field of Search ....................... 430/190, 192, 193

[56] References Cited

U.S. PATENT DOCUMENTS

| | | | |
|---|---|---|---|
| 3,046,118 | 7/1962 | Schmidt | 430/193 |
| 3,106,465 | 10/1963 | Neugebauer et al. | 430/193 |
| 3,130,047 | 4/1964 | Uhlig et al. | 430/193 |
| 3,148,983 | 9/1964 | Endermann et al. | 430/193 |
| 3,647,443 | 3/1972 | Rauner et al. | 430/190 |
| 3,759,711 | 9/1973 | Rauner et al. | 430/190 |
| 3,802,885 | 4/1974 | Lawson et al. | 96/75 |
| 4,365,019 | 12/1982 | Daly et al. | 430/190 |
| 4,499,171 | 2/1985 | Hosaka et al. | 430/193 |

*Primary Examiner*—Charles L. Bowers, Jr.
*Attorney, Agent, or Firm*—William J. Davis

[57] ABSTRACT

There is disclosed a photoresist composition comprising a light-sensitive, quinone diazide polymer, a binder and a benzene monomer trisubstituted with a diazo-naphthoquinone-sulfonyloxy group. The composition is improved in that the diazo-naphthoquinone-sulfonyloxy group occupies the 1,2,4-positions on the benzene ring, whereby improved solubility is achieved.

4 Claims, No Drawings

NON-PRECIPITATING QUINONE DIAZIDE POLYMER CONTAINING PHOTORESIST COMPOSITION WITH O-QUINONE DIAZIDE TRIESTER AS DISSOLUTION INHIBITOR

FIELD OF THE INVENTION

This invention relates to radiation-sensitive positive-working resists.

BACKGROUND OF THE INVENTION

A useful class of positive-working photoresist compositions comprises a polymer containing recurring groups with pendant quinone diazide groups that are light sensitive, and a photoactive dissolution inhibitor monomer that tends to crosslink the polymer by heat in areas wherein the quinone diazide has not been decomposed by exposure to activating radiation. One of the monomer's functions is to convert to a ketene that causes crosslinking, thereby providing thermal resistance, as is well known. Examples are described in U.S. Pat. No. 4,365,019, wherein the monomer comprises, e.g., 1,3,5-trihydroxybenzene esterified with 1,2-naphthoquinone diazide sulfonic acid.

Such resists have usually functioned very well. However, under certain conditions, such resist compositions have occasionally exhibited a tendency to crystallize out of solution, rendering it impossible to coat them into a layered format suitable for use as a resist on a substrate. There has been a need, therefore, prior to this invention, to find a modification that will keep the resist composition in solution for purposes of coating.

SUMMARY OF THE INVENTION

I have discovered that a positive-working photoresist composition of the type described above can be more readily retained in solution if the dissolution inhibitor monomer is modified.

More specifically, there is provided a photoresist composition comprising (a) a light-sensitive polymer containing a recurring pendant quinone diazide moiety, (b) a binder, and (c) a benzene monomer trisubstituted with a diazo-naphthoquinone-sulfonyloxy group. The composition is improved in that the aforesaid group occupies the 1,2,4-positions only, on the benzene ring.

Thus, it is an advantageous feature of the invention that a photoresist composition is provided comprising a polymer with pendant quinone diazide groups and a dissolution inhibitor monomer, that more readily remains in solution.

It is a related advantageous feature of the invention that such photoresist composition provides a monomer that still functions to thermally crosslink unexposed polymer.

Other objects and advantages will become apparent upon reference to the following description of the preferred embodiments.

DESCRIPTION OF THE PREFERRED EMBODIMENTS

The invention is hereinafter described particularly with regard to embodiments featuring certain preferred radiation-sensitive polymers and binders. In addition, it is useful in any positive-working photoresist composition wherein a monomer is needed to thermally crosslink unexposed polymers containing pendant quinone diazide moieties.

Conventionally, the positive-working photoresists with which the invention is used comprise the radiation-sensitive polymers described above, a binder, the dissolution inhibitor monomer, and optionally a development accelerator and/or surfactant. These are generally described in the aforesaid '019 patent. That is, the radiation-sensitive polymer can be any polymer having pendant quinone diazide groups, and preferably is either phenol- or cresolformaldehyde resin condensed with a 1,2-diazo-5-sulfonato-naphthoquinone, such resins being capped with such napthoquinones in an amount of from 3 to 5 weight %. The binder can be any polymer that provides the desired rheology or film properties for the resist solution and coating, respectively. Preferred are the binders of the '019 patent, or those described in commonly owned U.S. application Ser. No. 687,306, filed on Dec. 28, 1984, by Turner et al, entitled "High-Temperature Resistant, Selectively Developable Positive-Working Resist." In the latter case, the binder is a homopolymer or copolymer having recurring units with the structural formula:

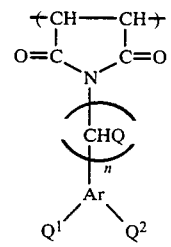

wherein Ar is substituted or unsubstituted aryl of from 6 to 10 carbon ring atoms, Q is hydrogen or alkyl of 1 to 5 carbon atoms, or aryl of 6 to 10 carbon atoms, substituents $Q^1$ and $Q^2$ are individually H, —OH, —COOH or

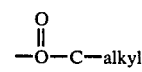

wherein alkyl contains from 1 to 5 carbon atoms, and n is an integer of from 0 to 3. Useful examples of Ar as an unsubstituted 6 to 10 carbon ring are phenyl and naphthyl. Useful examples of Q include hydrogen, methyl, and phenyl. Useful examples of the alkyl portion of $Q^1$ and $Q^2$ include methyl, ethyl, propyl, butyl, and pentyl.

The optional development accelerator can be any compound that enhances the development rate of the photoresist. Preferred are the heterocyclic compounds and particularly the polyhalogenated heterocycles described in the aforesaid '019 patent.

The optional surfactant is selected preferably so that the coatings are free of striations.

In accord with the invention, the dissolution inhibitor monomer preferably comprises, in at least 5 weight % of the dry composition, a compound having the following structural formula:

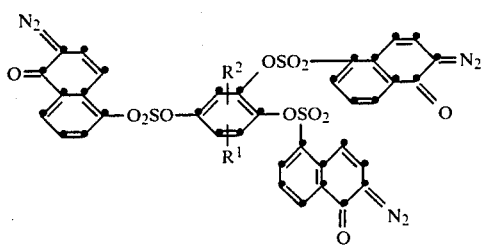

wherein $R^1$ and $R^2$ are individually H, or alkyl or alkoxy of 1-3 carbon atoms. In such a compound, useful examples of $R^1$ and $R^2$ as alkyl include methyl, ethyl, n-propyl and isopropyl. Useful examples of $R^1$ and $R^2$ as alkoxy include methoxy, ethoxy, n-propoxy and isopropoxy.

The following are the photoactive dissolution inhibitors considered to be particularly useful monomers:
1,2,4-tris(6-diazo-5,6-naphthoquinone-1-sulfonyloxy)benzene;*
3-methyl-1,2,4-tris(6-diazo-5,6-naphthoquinone-1-sulfonyloxy)benzene;
3,5-dimethyl-1,2,4-tris(6-diazo-5,6-naphthoquinone-1-sulfonyloxy)benzene;
3,6-dimethyl-1,2,4-tris(6-diazo-5,6-naphthoquinone-1-sulfonyloxy)benzene;
5,6-dimethyl-1,2,4-tris(6-diazo-5,6-naphthoquinone-1-sulfonyloxy)benzene;
3,5,6-trimethyl-1,2,4-tris(6-diazo-5,6-naphthoquinone-1-sulfonyloxy)benzene;
5-methyl-1,2,4-tris(6-diazo-5,6-naphthoquinone-1-sulfonyloxy)benzene;
6-methyl-1,2,4-tris(6-diazo-5,6-naphthoquinone-1-sulfonyloxy)benzene;
3-methoxy-1,2,4-tris(6-diazo-5,6-naphthoquinone-1-sulfonyloxy)benzene;
3,5-dimethoxy-1,2,4-tris(6-diazo-5,6-naphthoquinone-1-sulfonyloxy)benzene;
3,6-dimethoxy-1,2,4-tris(6-diazo-5,6-naphthoquinone-1-sulfonyloxy)benzene;
5,6-dimethoxy-1,2,4-tris(6-diazo-5,6-naphthoquinone-1-sulfonyloxy)benzene;
3,5,6-trimethoxy-1,2,4-tris(6-diazo-5,6-naphthoquinone-1-sulfonyloxy)benzene;
5-methoxy-1,2,4-tris(6-diazo-5,6-naphthoquinone-1-sulfonyloxy)benzene; and
6-methoxy-1,2,4-tris(6-diazo-5,6-naphthoquinone-1-sulfonyloxy)benzene.

*Alternatively named as 1,2,4-benzenetriyl tris(6-diazo-5-oxo-1-naphthylenesulfonate).

The preparation of such monomers is via conventional synthetic routes. For example, 1,2,4-tris-(6-diazo-5,6-naphthoquinone-1-sulfonyloxy)benzene was prepared by dissolving 2-diazo-1,2-napthoquinone-5-sulfonylchloride (24.2 g, 0.09 mol) in tetrahydrofuran (200mL) in a 1000 mL glass reaction vessel equipped with stirring and a thermometer. The solution was cooled to 0°-5° C. in an ice bath and 1,2,-4-benzenetriol (3.8 g, 0.03 mol) added. A solution of triethylamine (9.1 g, 0.09 mol) in tetrahydrofuran (20 mL) was added dropwise so as to maintain the temperature below 10° C. When the addition was complete, the temperature was allowed to rise to room temperature (20° C.). The solution was stirred for 1.5 hours. Ethyl acetate (100 mL) was added to the reaction mixture followed by the slow addition of a cooled solution of 7% aqueous HCl (100 mL). The aqueous layer was removed and the organic layer washed with distilled water (100 mL) to remove traces of acid. The aqueous wash was removed and the organic layer isolated and dried over magnesium sulfate (20 g). The drying agent was removed by filtration and the organic solution filtered through a 0.25 micron fluoropore filter under positive pressure. The filtered solution was added to a stirring mixture of heptane (1000 mL) and methanol (40 mL). The product precipitated as a light yellow powder. The solid was collected by suction filtration on a fritted glass funnel. Air was suctioned through the solid to remove traces of solvent until the solid was a dry powder (~45 min on this scale). The solid was then further dried under vacuum at 20° C. for three days. Yield: 21 g 85%, mp 145° C. Anal. Calc'd. for $C_{36}H_{18}N_6O_{12}S_3$: C, 52.6; H, 2.2; N, 10.2. Found: C, 52.3; H, 2.5; N, 9.9. Infrared (KBr): $\nu C=O$ 1625 cm$^{-1}$, $\nu SO_3$ 1190, 1375 cm$^{-1}$. $1_H$ NMR spectrum was consistent with the proposed structure. Mass spectrum: m/e 823.

The amounts of the components of such a resist composition vary, depending upon the intended use. The 1,2,4-trisubstituted benzene monomer can be used as the sole monomer, or in admixture with another monomer such as the 1,3,5-isomer of the monomer of the invention. In the latter case, preferably the mixture is a 1:1 mixture comprising about 10 weight % of the composition. If the 1,2,4-monomer is used alone, then its amount is preferably from about 5 to about 10 weight % of the resist composition.

The radiation-sensitive quinone diazide polymer or condensation product preferably comprises from about 1.0 to about 15 weight % of the resist composition. The development accelerator comprises from zero to about 30 weight % of the resist composition.

The solvent used to prepare the resist composition for coating can be selected from any conventional coating solvent.

The composition of the invention has been found to provide unexpected superior solubility without sacrificing thermal resistance. That is, the dissolution inhibitor monomer of the invention keeps the composition in solution while at the same time unexpectedly retaining a superior ability to thermally crosslink with the light-sensitive polymer in unexposed areas.

EXAMPLES

The following examples further illustrate the scope of the invention.

EXAMPLE 1

ENHANCED SOLUBILITY

On the theory that it was the dissolution inhibitor monomer that caused the insolubility problems, the monomer of Table I below was compared with the noted Comparative Example 1 for storage solubility, in 10.6 g of three different solvents commonly used to coat positive-working photoresists, namely 2-ethoxyethyl acetate/4-butyrolactone (90/10), 2-ethoxyethyl acetate/4-butyrolactone (86/14), and 2-ethoxyethyl acetate/4-butyrolactone (82/18). The solutions were stored for several weeks after being thoroughly mixed and rolled continously to promote nucleation and crystal growth.

TABLE I

| Example | Monomer | Solubility |
|---------|---------|------------|
| 1 | 1,2,4-tris-(6-diazo-5,6-naphthoquinone- | In solution at end of storage period |

TABLE I-continued

| Example | Monomer | Solubility |
|---|---|---|
| | 1-sulfonyloxy)benzene (0.656 g) | |
| Comp. Ex. 1 | 1,3,5-tris-(6-diazo-5,6-naphthoquinone-1-sulfonyloxy)benzene (0.656 g) | Precipitated out of solution after several hours |

When the experiment was repeated but at a monomer concentration of 7.5 wt/wt, the results were the same. When the experiment was further repeated using various mixtures of Example 1 and of the Comparative Example, the samples remained in solution so long as there was at least 10 wt % of the 1,2,4-isomer present.

EXAMPLES 2-5

RESIST USAGE

The composition of Table 2 below, using the monomer or monomer mixtures of Table 3 below, was prepared at a concentration of 31.75% wt/vol and spin coated on primed $SiO_2$ wafers at 5600 rpm. The wafers were prebaked at 120° C. for 60 sec on a hot/chill plate and exposed on a TRE-800 instrument made by TRE Semiconductor Equipment Corp. The wafers were batch developed for 60 sec at 21° C. in an aqueous developer containing 3% $(CH_3)_4NOH$ and a surfactant, with nitrogen agitation. Measurements were made on the thickness of the coatings before development and after development (data in Table 4). Minimum exposures were measured to clean out 2 μm lines with 2 μm spaces (data in Table 4). Postbaking the wafers at 140° C., 145° C. and 150° C. for 30 min did not change the image profile.

TABLE 2

Resist Composition

[chemical structure diagram]

having a Mw less than 20,000
poly[methylmethacrylate-co-methacrylic acid] (Mw less than 50,000) (binder)
monomer of Table 3
polychlorinated benzotriazole (development accelerator)
a non-ionic surfactant
glacial acetic acid stabliizer
2-ethoxyethyl acetate solvent

TABLE 3

| Example | Monomers Monomer |
|---|---|
| 2 | 1,2,4-tris(6-diazo-5,6-naphthoquinone-1-sulfonyloxy)benzene/1,3,5-tris(6-diazo-5,6-naphthoquinone-1-sulfonyloxy)benzene (10:90) |
| 3 | 1,2,4-tris(6-diazo-5,6-naphthoquinone-1-sulfonyloxy)benzene/1,3,5-tris(6-diazo-5,6-naphthoquinone-1-sulfonyloxy)benzene (20:80) |
| 4 | 1,2,4-tris(6-diazo-5,6-naphthoquinone-1-sulfonyloxy)benzene/1,3,5-tris(6-diazo-5,6-naphthoquinone-1-sulfonyloxy)benzene (50:50) |
| 5 | 1,2,4-tris(6-diazo-5,6-naphthoquinone-1-sulfonyloxy)benzene |
| Comp. Ex. 1 | 1,3,5-tris(6-diazo-5,6-naphthoquinone-1-sulfonyloxy)benzene |

TABLE 4

| Example | Development Results | | | | |
|---|---|---|---|---|---|
| | Average* Thickness Before Develop. | Average* Thickness After Develop. | ΔT (Å) | Loss (%) | Min. exposure for cleanout (msec) |
| 2 | 11855(271) | 11366(61) | −489 | 4.1 | 80 |
| 3 | 11844(50) | 11269(273) | −575 | 4.9 | 80 |
| 4 | 12240(52) | 11665(40) | −575 | 4.7 | 75 |
| 5 | 12400(13) | 11684(94) | −716 | 5.8 | 75 |
| Comp. Ex. 1 | 11818(285) | 11319(295) | −499 | 4.2 | 80 |

*The average is that of readings taken at 5 different locations on the wafer. The number in the ( ) is the standard deviation.

The significance of the exposure for the cleanout column is that all the samples illustrated about the same speed or sensitivity to light. Even values as high as 85 are considered comparable. Similarly, the % loss (measured in the unexposed regions) was acceptable in all four of these examples and the one comparative example. That is, such % loss is considered acceptable if it does not exceed 10%.

EXAMPLE 6

IMPROVED CROSSLINKING

To demonstrate the superior crosslinking ability of the monomer after development, Example 2-5 above were repeated. For comparison purposes, a Comparative Example 2 was prepared wherein the monomer comprised 1,2,3-tris(6-diazo-5,6-naphthoquinone-1-sulfonyloxy)benzene in an equal amount. Coatings were made on a wafer, equally exposed, and developed until equivalent critical dimensions were obtained. Thereafter, post-baking occurred at 150° C. for 30 min. Whereas Example 6 showed no rounding of the edges of the resist image, Comparative Example 2 suffered considerable rounding (as determined by SEM's.) This could only mean that the 1,2,3-isomer was not providing the necessary post-bake crosslinking, even though the other non-symmetric monomer, the 1,2,4-isomer, did.

The invention has been described in detail with particular reference to preferred embodiments thereof, but it will be understood that variations and modifications can be effected within the spirit and scope of the invention.

What is claimed is:

1. A positive-working photoresist composition comprising, in admixture, (a) a light-sensitive polymer containing a recurring pendant quinone diazide moiety, said polymer being present in an amount effective to render said resist composition light-sensitive, (b) a binder present in an amount effective to render said composition film-forming, and (c) a photoactive dissolution inhibitor present in an amount effective to crosslink said polymer in areas wherein said quinone diazide moiety is not decomposed by exposure to activating radiation, wherein said photoactive dissolution inhibitor is a diazo-naphthoquinone-sulfonyl ester of a 1,2,4-benzenetriol having each of said 1, 2 and 4 positions esterified with a diazo-naphthoquinone-sulfonyl group.

2. A positive-working photoresist composition comprising, in admixture, (a) a light-sensitive polymer containing a recurring pendant quinone diazide moiety, said polymer being present in an amount effective to render said resist composition light-sensitive, (b) a binder present in an amount effective to render said composition film-forming, and (c) a photoactive dissolution inhibitor present in an amount effective to crosslink said polymer in areas wherein said quinone diazide moiety is not decomposed by exposure to activating radiation, wherein said photoactive dissolution inhibitor has the following structural formula:

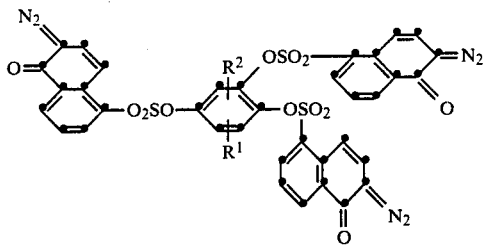

wherein $R^1$ and $R^2$ are individually H, or alkyl or alkoxy of 1–3 carbon atoms, said photoactive dissolution inhibitor being present in an amount of at least 5 weight % of said composition.

3. A composition as defined in claim 1 or 2 wherein said photoactive dissolution inhibitor is 1,2,4-tris(6-diazo-5,6-naphthoquinone-1-sulfonyloxy)benzene.

4. A composition as defined in claim 1 wherein said photoactive dissolution inhibitor is selected from the group consisting of:
1,2,4-tris(6-diazo-5,6-naphthoquinone-1-sulfonyloxy)benzene;
3-methyl-1,2,4-tris(6-diazo-5,6-naphthoquinone-1-sulfonyloxy)benzene;
3,5-dimethyl-1,2,4-tris(6-diazo-5,6-naphthoquinone-1-sulfonyloxy)benzene;
3,6-dimethyl-1,2,4-tris(6-diazo-5,6-naphthoquinone-1-sulfonyloxy)benzene;
5,6-dimethyl-1,2,4-tris(6-diazo-5,6-naphthoquinone-1-sulfonyloxy)benzene;
3,5,6-trimethyl-1,2,4-tris(6-diazo-5,6-naphthoquinone-1-sulfonyloxy)benzene;
5-methyl-1,2,4-tris(6-diazo-5,6-naphthoquinone-1-sulfonyloxy)benzene;
6-methyl-1,2,4-tris(6-diazo-5,6-naphthoquinone-1-sulfonyloxy)benzene;
3-methoxy-1,2,4-tris(6-diazo-5,6-naphthoquinone-1-sulfonyloxy)benzene;
3,5-dimethoxy-1,2,4-tris(6-diazo-5,6-naphthoquinone-1-sulfonyloxy)benzene;
3,6-dimethoxy-1,2,4-tris(6-diazo-5,6-naphthoquinone-1-sulfonyloxy)benzene;
5,6-dimethoxy-1,2,4-tris(6-diazo-5,6-naphthoquinone-1-sulfonyloxy)benzene;
3,5,6-trimethoxy-1,2,4-tris(6-diazo-5,6-naphthoquinone-1-sulfonyloxy)benzene;
5-methoxy-1,2,4-tris(6-diazo-5,6-naphthoquinone-1-sulfonyloxy)benzene; and
6-methoxy-1,2,4-tris(6-diazo-5,6-naphthoquinone-1-sulfonyloxy)benzene.

* * * * *